US012575214B2

(12) United States Patent
Chen et al.

(10) Patent No.: US 12,575,214 B2
(45) Date of Patent: Mar. 10, 2026

(54) SOLAR CELL AND PREPARATION METHOD THEREOF

(71) Applicant: TRINA SOLAR CO., LTD.,
Changzhou (CN)

(72) Inventors: Daming Chen, Changzhou (CN); Kuiyi Wu, Changzhou (CN); Zigang Wang, Changzhou (CN); Yifeng Chen, Changzhou (CN)

(73) Assignee: TRINA SOLAR CO., LTD.,
Changzhou (CN)

( * ) Notice: Subject to any disclaimer, the term of this patent is extended or adjusted under 35 U.S.C. 154(b) by 0 days.

(21) Appl. No.: 18/809,664

(22) Filed: Aug. 20, 2024

(65) Prior Publication Data

US 2024/0413261 A1 Dec. 12, 2024

(30) Foreign Application Priority Data

Feb. 1, 2024 (CN) ......................... 202410140805.X

(51) Int. Cl.
H10F 71/00 (2025.01)
B23K 26/082 (2014.01)
(Continued)

(52) U.S. Cl.
CPC ........... H10F 71/00 (2025.01); B23K 26/082 (2015.10); B23K 26/36 (2013.01); H10F 77/215 (2025.01);
(Continued)

(58) Field of Classification Search
CPC ...... H10F 71/00; H10F 77/211; H10F 77/215; H10F 77/219; H10F 77/311; B23K 26/082; B23K 26/36; B23K 2101/40
See application file for complete search history.

(56) References Cited

U.S. PATENT DOCUMENTS 5,676,866 A 10/1997 in den Baumen et al.
9,761,752 B2 9/2017 Uzu et al.
(Continued)

FOREIGN PATENT DOCUMENTS

CN 101431126 A 5/2009
CN 208336240 U * 1/2019
(Continued)

OTHER PUBLICATIONS

Machine translation of JP-H05259487-A, Hirano. (Year: 1993).*
(Continued)

*Primary Examiner* — Mayla Gonzalez Ramos
(74) *Attorney, Agent, or Firm* — MARSHALL, GERSTEIN & BORUN LLP

(57) ABSTRACT

A method for preparing a solar cell includes providing a substrate with a first conducting layer, the substrate including a first surface and a second surface opposite to each other in a thickness direction of the substrate, the first conducting layer being formed on the first surface; forming a first electrode pattern on a side of the first conducting layer away from the substrate, the first electrode pattern being electrically connected to the first conducting layer, the first electrode pattern including a first soldering pattern, the first soldering pattern being configured for soldering to one or more first bus ribbons; forming a first dielectric layer on a side of the first electrode pattern away from the substrate, and covering the first electrode pattern with the first dielectric layer; and removing a portion of the first dielectric layer corresponding to the first soldering pattern, and exposing the first soldering pattern.

19 Claims, 6 Drawing Sheets

(51) Int. Cl.

| | |
|---|---|
| *B23K 26/36* | (2014.01) |
| *B23K 101/40* | (2006.01) |
| *H10F 77/20* | (2025.01) |
| *H10F 77/30* | (2025.01) |

(52) U.S. Cl.
CPC ......... *H10F 77/219* (2025.01); *H10F 77/311* (2025.01); *B23K 2101/40* (2018.08)

(56) References Cited

U.S. PATENT DOCUMENTS

| | | | |
|---|---|---|---|
| 2011/0308608 A1 | 12/2011 | Shim et al. | |
| 2012/0204928 A1* | 8/2012 | Kutzer | H10F 71/121 |
| | | | 136/255 |
| 2014/0060638 A1 | 3/2014 | Oh et al. | |
| 2014/0096823 A1* | 4/2014 | Fu | H10F 10/14 |
| | | | 438/96 |
| 2014/0299187 A1 | 10/2014 | Chang et al. | |
| 2015/0007877 A1 | 1/2015 | Brainard et al. | |
| 2015/0059822 A1 | 3/2015 | Krokoszinski | |
| 2016/0104810 A1 | 4/2016 | Adachi | |
| 2016/0225935 A1 | 8/2016 | Park et al. | |
| 2016/0308079 A1 | 10/2016 | Adachi et al. | |
| 2018/0006165 A1 | 1/2018 | Yoshikawa et al. | |
| 2018/0083152 A1 | 3/2018 | Yoshikawa et al. | |
| 2019/0044013 A1 | 2/2019 | Hyun et al. | |
| 2019/0157478 A1 | 5/2019 | Watabe et al. | |
| 2019/0280134 A1 | 9/2019 | Yan et al. | |
| 2023/0317377 A1 | 10/2023 | Gotanda et al. | |

FOREIGN PATENT DOCUMENTS

| | | | |
|---|---|---|---|
| CN | 109994554 A | 7/2019 | |
| CN | 211654837 U | 10/2020 | |
| CN | 112086525 A | 12/2020 | |
| CN | 112485979 A | 3/2021 | |
| CN | 113809185 A | 12/2021 | |
| CN | 114122161 A | 3/2022 | |
| CN | 115020525 A | 9/2022 | |
| CN | 218730968 U | 3/2023 | |
| CN | 220106554 U | 11/2023 | |
| JP | h4339585 A | 11/1992 | |
| JP | H04348569 A | 12/1992 | |
| JP | H05259487 A * | 10/1993 | |
| JP | H7308788 A | 11/1995 | |
| JP | 2000312016 A | 11/2000 | |
| JP | 2007214372 A * | 8/2007 | H10F 10/14 |
| JP | 2008-264860 A | 11/2008 | |
| JP | 2011121106 A | 6/2011 | |
| JP | 2011222585 A | 11/2011 | |
| JP | 5-259487 B2 | 8/2013 | |
| JP | 2014103259 A | 6/2014 | |
| JP | 2014123587 A | 7/2014 | |
| JP | 3205613 U | 8/2016 | |
| WO | WO-2011/027532 A1 | 3/2011 | |
| WO | WO-2014/189058 A1 | 11/2014 | |
| WO | WO-2015126438 A1 * | 8/2015 | B23K 26/0821 |

OTHER PUBLICATIONS

Machine translation of JP-2007214372-A, Ishii Shuzo. (Year: 2007).*

Machine translation of WO-2015126438-A1, Dey Rohit. (Year: 2015).*

Machine translation of CN-208336240-U, Zhang, Wei. (Year: 2019).*

Office Action, Japanese Application No. 2024-106210, dated Feb. 26, 2025.

Office Action, Japanese Application No. 2024-106210, dated Aug. 30, 2024.

Office Action, Australian Application No. 2024204651, dated Aug. 19, 2024.

Office Action, Chinese Application No. 202410140805.X, dated Mar. 28, 2024.

Office Action, Chinese Application No. 202410140805.X, dated Apr. 16, 2024.

Decision of Grant, Chinese Application No. 202410140805.X, dated May 16, 2024.

* cited by examiner

131

1311

10

182

181

181

182

10

SOLAR CELL AND PREPARATION METHOD THEREOF

CROSS-REFERENCE TO RELATED APPLICATION

This application claims priority to Chinese patent application No. 202410140805.X, filed on Feb. 1, 2024, and titled "SOLAR CELL AND PREPARATION METHOD THEREOF", the content of which is hereby incorporated herein in its entirety by reference.

TECHNICAL FIELD

The present application relates to the field of photovoltaic device technology, specifically to solar cells and preparation methods thereof.

BACKGROUND

In recent years, there has been a growing demand in the market for solar cells. This has given rise to a variety of high-efficiency solar cells, which are produced using different manufacturing techniques.

In the process for preparing solar cells with patterned metal electrodes in related art, a dielectric layer is firstly formed on the surface of a substrate. Then a metal paste is screen printed on the dielectric layer and sintered at a high-temperature, enabling the metal to burn through the dielectric layer and to establish contact with the substrate or the emitters, thereby forming metal grid electrodes. These electrodes are directly exposed, facilitating the direct soldering of metal bus ribbons onto the electrodes in the subsequent assembly steps. The bus ribbons are applied for electrical connection among multiple solar cells. However, this method faces limitations due to the properties of conductive pastes. For instance, a paste solely composed of silver cannot burn through a dielectric layer made of silicon nitride and aluminum oxide without incorporating a small amount of special glass materials (such as lead glass or tellurium glass). This restricts the choice of electrode materials. Alternatively, another approach involves removing the passivation layer through laser ablation before forming the metal grid electrodes via screen printing and sintering. However, this approach may easily damage the solar cell and potentially degrading its performance.

SUMMARY

In view of the above, there is a need to provide a solar cell and a preparation method thereof.

A first aspect of the present application provides a method for preparing a solar cell, including:

providing a substrate with a first conducting layer, the substrate including a first surface and a second surface opposite to each other in the thickness direction of the substrate, the first conducting layer being formed on the first surface;

forming a first electrode pattern on the side of the first conducting layer away from the substrate, the first electrode pattern being electrically connected to the first conducting layer, the first electrode pattern including a first soldering pattern, the first soldering pattern being configured for soldering to one or more first bus ribbons;

forming a first dielectric layer on the side of the first electrode pattern away from the substrate, and covering the first electrode pattern with the first dielectric layer; and removing a portion of the first dielectric layer corresponding to the first soldering pattern, and exposing the first soldering pattern.

In some embodiments, the solar cell further includes a second dielectric layer disposed between the first conducting layer and the first electrode pattern, and the first electrode pattern penetrates through the second dielectric layer to be electrically connected to the first conducting layer. In these embodiments, the preparation method further includes:

forming the second dielectric layer on the side of the first conducting layer away from the substrate before forming the first electrode pattern;

forming a first conductive paste pattern on the surface of the second dielectric layer away from the substrate, where the first conductive paste pattern matches the first electrode pattern in shape; and sintering the first conductive paste pattern, causing the first conductive paste pattern to penetrate through the second dielectric layer, such that an ohmic contact is formed between a conductive material in the first conductive paste pattern and the first conducting layer, thereby forming the first electrode pattern.

In some embodiments, forming the first dielectric layer on the side of the first electrode pattern away from the substrate includes:

depositing the first dielectric layer on the side of the first electrode pattern away from the substrate, thereby covering the first electrode pattern and a portion of the first surface with the first dielectric layer.

In some embodiments, removing the portion of the first dielectric layer corresponding to the first soldering pattern includes:

laser ablating the portion of the first dielectric layer corresponding to the first soldering pattern.

In some embodiments, laser ablating the portion of the first dielectric layer corresponding to the first soldering pattern includes:

patterning a laser beam into a plurality of laser spots through a scanning galvanometer mirror, the plurality of laser spots being in a preset pattern matching the first soldering pattern in shape; and projecting the plurality of laser spots onto the portion of the first dielectric layer corresponding to the first soldering pattern, and removing the portion of the first dielectric layer by laser ablation.

In some embodiments, before patterning the laser beam, the method further includes amplifying and focusing the laser beam.

In some embodiments, the frequency of the laser beam adopted in the laser ablation ranges from 1.5 MHz to 2.5 MHz, the moving speed of the laser beam ranges from 200 mm/s to 300 mm/s, the pulse width of the laser beam ranges from 10 ps to 50 ns, and the diameter of the laser spot ranges from 8 μm to 500 μm.

In some embodiments, the first soldering pattern includes one or more rectangular solder spots, the length of each rectangular solder spot ranges from 10 μm to 700 μm, and the width of each rectangular solder spot ranges from 10 μm to 700 μm.

In some embodiments, the first electrode pattern includes busbars and finger electrodes, and the first soldering pattern is located in the busbars.

In some embodiments, the width of each busbar ranges from 10 μm to 2 mm, and the width of each finger electrode ranges from 10 μm to 40 μm.

In some embodiments, the solar cell further includes a second conducting layer, the second conducting layer is formed on the second surface of the substrate; the preparation method further includes:

forming a second electrode pattern on the side of the second conducting layer away from the substrate, the second electrode pattern being electrically connected to the second conducting layer, the second electrode pattern including a second soldering pattern, the second soldering pattern being configured for soldering to one or more second bus ribbons;

forming a third dielectric layer on the side of the second electrode pattern away from the substrate, and covering the second electrode pattern with the third dielectric layer;

removing the portion of the third dielectric layer corresponding to the second soldering pattern, and exposing the second soldering pattern.

In some embodiments, the solar cell further includes a fourth dielectric layer disposed between the second conducting layer and the second electrode pattern, and the second electrode pattern penetrates through the fourth dielectric layer to be electrically connected to the second conducting layer. The preparation method further includes:

forming the fourth dielectric layer on the side of the second conducting layer away from the substrate before forming the second electrode pattern on the side of the second conducting layer away from the substrate;

forming a second conductive paste pattern on a surface of the fourth dielectric layer away from the substrate, where the second conductive paste pattern matches the second electrode pattern in shape;

sintering the second conductive paste pattern, causing the second conductive paste pattern to penetrate through the fourth dielectric layer, such that an ohmic contact is formed between a conductive material in the second conductive paste pattern and the second conducting layer, and forming the second electrode pattern.

In some embodiments, forming the third dielectric layer on the side of the second electrode pattern away from the substrate includes:

depositing the third dielectric layer on the side of the second electrode pattern away from the substrate, thereby covering the second electrode pattern and a portion of the second surface with the third dielectric layer.

A second aspect of the present application provides a solar cell, including a substrate, a first conducting layer, a first electrode pattern, and a first dielectric layer.

The substrate includes a first surface and a second surface opposite to each other in the thickness direction of the substrate. The first conducting layer is disposed on the first surface of the substrate.

The first electrode pattern is disposed on the side of the first conducting layer away from the substrate. The first electrode pattern is electrically connected to the first conducting layer. The first electrode pattern includes a first soldering pattern.

The first dielectric layer is disposed on the side of the first electrode pattern away from the substrate. The first dielectric layer includes a plurality of first openings corresponding to the first soldering pattern, and the first soldering pattern is exposed through the first openings. The first soldering pattern is configured for soldering to one or more first bus ribbons.

In some embodiments, the first dielectric layer covers a portion of the first surface, and the portion of the first surface is beyond the first soldering pattern.

In some embodiments, the first dielectric layer is made of at least one of silicon dioxide, silicon nitride, silicon oxynitride, or aluminum oxide.

In some embodiments, a thickness of the first dielectric layer ranges from 20 nm to 100 nm.

In some embodiments, the surface of the first dielectric layer away from the substrate is aligned with the surface of the first soldering pattern away from the substrate.

In some embodiments, the solar cell further includes a second dielectric layer disposed between the first conducting layer and the first electrode pattern. The second dielectric layer includes first slots. The first electrode pattern penetrates through the first slots and is electrically connected to the first conducting layer.

In some embodiments, the second dielectric layer is made of at least one of silicon dioxide, silicon nitride, silicon oxynitride, and aluminum oxide.

In some embodiments, a thickness of the second dielectric layer ranges from 20 nm to 100 nm.

In some embodiments, the solar cell further includes a second conducting layer, a second electrode pattern, and a third dielectric layer, which are sequentially stacked on the second surface of the substrate.

The second electrode pattern is electrically connected to the second conducting layer. The second electrode pattern includes a second soldering pattern.

The third dielectric layer is disposed on the side of the second electrode pattern away from the substrate. The third dielectric layer includes a plurality of second openings corresponding to the second soldering pattern, and the second soldering pattern is exposed through the second openings. The second soldering pattern is configured for soldering to one or more second bus ribbons.

In some embodiments, the solar cell further includes a fourth dielectric layer disposed between the second conducting layer and the second electrode pattern.

In some embodiments, the third dielectric layer covers a portion of the second surface, and the portion of the second surface is beyond the second soldering pattern.

In some embodiments, the third dielectric layer is made of at least one of silicon dioxide, silicon nitride, silicon oxynitride, and aluminum oxide.

REFERENCE SIGNS

Figure 1:
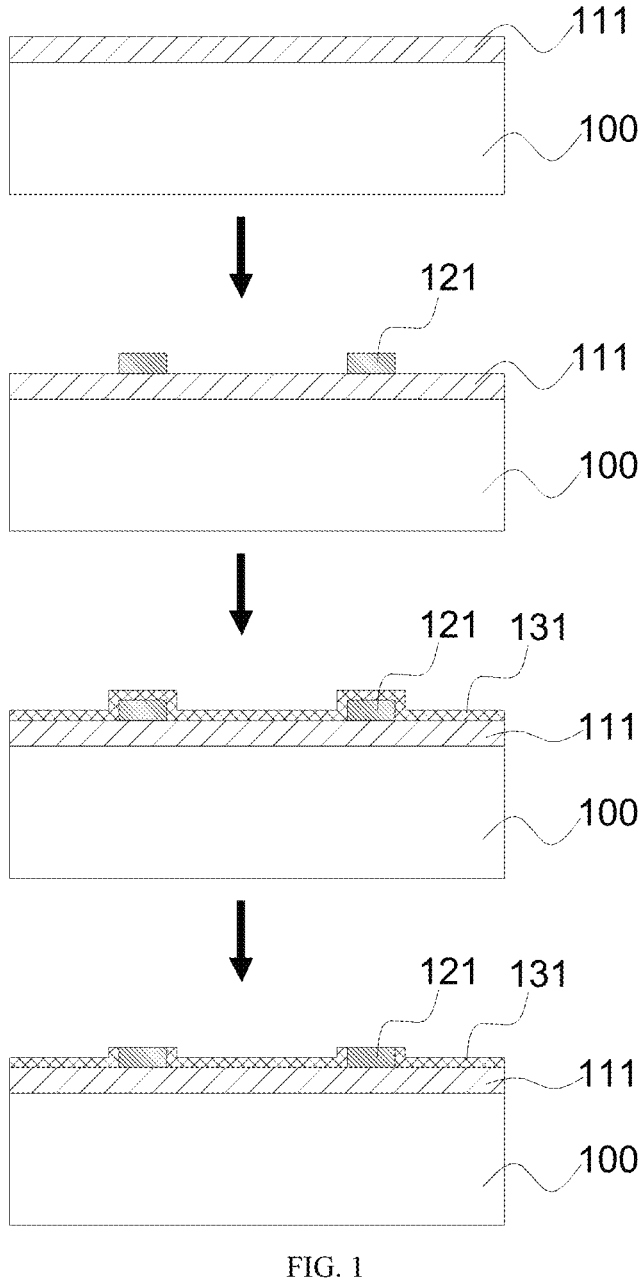
FIG. 1 is a schematic view of a method for preparing a solar cell according to an embodiment of the present application.

10, solar cell; 100, substrate; 111, first conducting layer; 111', first transparent conducting layer; 112, second conducting layer; 112', second transparent conducting layer; 121, first electrode pattern; 1211, first soldering pattern; 1212, basbar; 1213, finger electrode; 122, second electrode pattern; 131, first dielectric layer; 1311, first opening; 141, second dielectric layer; 132, third dielectric layer; 142, fourth dielectric layer; 151, first conductive paste pattern; 152, second conductive paste pattern; 161, first amorphous silicon layer; 162, second amorphous silicon layer; 171, first doping layer; 172, second doping layer; 181, first bus ribbon; 182, second bus ribbon; 21, laser; 22, first mirror; 23, second mirror; 24, beam expander; 25, third mirror; 26, fourth mirror; 27, scanning galvanometer mirror; 28, field lens; 29, worktable.

DETAILED DESCRIPTION

The present application will now be described in detail with reference to the embodiments and examples. The embodiments and examples are for illustration only and not intended to limit the scope of the present application. The purpose of providing these embodiments and examples is to make the understanding of the present application more thorough and comprehensive. The present application can be implemented in many different forms and therefore is not limited to the embodiments and examples described herein. Those skilled in the art can make various changes or modifications to the present application without departing from the connotation of the present application, and equivalent forms obtained also fall within the protection scope of the present application. Many specific details are disclosed in the following description to facilitate a comprehensive understanding of the present application. However, it should be noted that the present application can be implemented without one or more of the specific details.

Unless defined otherwise, all technical and scientific terms used herein have the same meaning as commonly understood by those skilled in the art of the present application. The terms used in the specification of the present application are for the purpose of describing exemplary examples only and are not intended to limit the present application.

In the present application, "optionally," "optional," and "option" mean that the element being modified is not mandatory, indicating a choice between with or without the element. If the term "optionally" or the like appears multiple times in the same technical solution, unless specifically stated otherwise, and there are no contradictions or mutually exclusive conditions, then each "optionally" is independent of the others.

In the present application, the terms "first" and "second" are used merely as labels to distinguish one element having a certain name from another element having the same name, and cannot be understood as indicating or implying any priority, precedence, or order of one element over another, or indicating the quantity of the element. Therefore, the element modified by "first" or "second" may explicitly or implicitly includes at least one of the elements. In the description of the present disclosure, "a plurality of" means at least two, such as two, three, etc., unless otherwise specifically defined.

In the present application, an open-ended description for the technical features includes not only a close-ended technical solution consisting of the recited technical features, but also an open-ended technical solution including the recited technical features.

In the present application, unless otherwise specified, when a numerical interval (i.e., a numerical range) is referred to, the suitable values are considered as continuously distributed within this numerical interval and include both endpoints of the numerical range (i.e., the minimum value and the maximum value), as well as every value between the two endpoints. Unless otherwise specified, when a numerical interval is referred to as encompassing only integers within the numerical interval, it includes the integers at both endpoints of the numerical interval, and every integer between the endpoints. When multiple ranges are provided to describe a feature or a characteristic, these ranges can be combined. In other words, ranges disclosed herein are to be construed to include any or all sub-ranges subsumed therein, unless otherwise specified. The "value" within the numerical interval can be any quantitative value, such as a number, a percentage, a ratio, etc. The "numerical interval" can broadly encompass quantitative intervals, such as a percentage interval, a proportion interval, a ratio interval, etc.

All documents mentioned in the present application are incorporated herein by reference as if each document is individually incorporated by reference. Unless there is a conflict with the objects and/or technical solutions of the present application, the referenced documents related to the present application are incorporated in their entireties and for all purposes. When referencing a document in the present application, the definitions of relevant technical features, terms, nouns, phrases, etc. in the document are also referenced. When referencing a document in the present application, the examples and preferred modes of the related technical features that are referenced can also be incorporated into the present application by reference, provided that the present application can be implemented. It should be understood that when the referenced content conflicts with the description of the present application, the present application should prevail or the referenced content shall be adaptively modified according to the description of the present application.

In related art of the preparation methods of solar cell, a dielectric layer is formed first on the surface of a substrate. Then a metal paste is screen printed on the dielectric layer and sintered at a high-temperature, enabling the metal to burn through the dielectric layer and to establish contact with the substrate or the emitters, thereby forming metal grid electrodes. Under certain conditions, the dielectric layer (for example, an anti-reflection layer) is prepared after the metallization for forming the electrodes. However, the presence of the anti-reflection layer prevents bus ribbons from being welded with the grid electrodes during the assembly process, making it impossible to use the widely applied thermal welding technique in such cell structures. In contrast, the present application proposes forming an electrode pattern which includes a soldering pattern on one side of the substrate first, then covering the electrode pattern with a dielectric layer, removing the dielectric layer from the area where the soldering pattern is located to expose the soldering pattern for soldering to bus ribbons. This method is simple and has high efficiency.

Referring to FIG. 1, according to a first aspect of the present application, an embodiment of a method for preparing a solar cell includes:

providing a substrate 100 with a first conducting layer 11, the substrate 100 including a first surface and a second surface opposite to each other in the thickness direction of the substrate, the first conducting layer 111 being formed on the first surface of the substrate 100;

forming a first electrode pattern 121 on the side of the first conducting layer 111 away from the substrate 100, the first electrode pattern 121 being electrically connected to the first conducting layer 111, the first electrode pattern 121 including a first soldering pattern, the first soldering pattern being configured for soldering to one or more first bus ribbons;

forming a first dielectric layer 131 on the side of the first electrode pattern 121 away from the substrate 100, thereby covering the first electrode pattern 121 with the first dielectric layer 131; and removing the portion of the first dielectric layer 131 corresponding to the first soldering pattern, thereby exposing the first soldering pattern from the remaining first dielectric layer 131.

In the above embodiment of the method for preparing the solar cell, a first electrode pattern including a first soldering pattern is firstly formed on a side of the substrate, which is then covered with a first dielectric layer. The portion of the first dielectric layer corresponding to the first soldering pattern is then removed to expose the first soldering pattern, so as to ensure a stable connection with bus ribbons. The electrode pattern not only includes the soldering pattern configured for soldering with the bus ribbons but also protects the substrate, avoiding damage to the substrate in the first dielectric layer partially removing step. Furthermore, the choice of electrode materials is not limited by the choice of dielectric layer materials in the electrode pattern forming process, making the present method applicable to various types of solar cells.

It should be noted that the substrate 100 in the present application can be a silicon substrate including a p-n junction, where the first surface can be the front or back surface of the silicon substrate, and the first conducting layer 111 can be a doping layer or a transparent conducting layer. For example, when the solar cell is a tunnel oxide passivated contact (TOPCon) solar cell, the first conducting layer 111 can be a p-type doping layer; when the solar cell is a heterojunction (HJT) solar cell, the first conducting layer 111 can be a transparent conductive oxide layer. It can be understood that the first electrode pattern 121 in the present application can be either a front grid electrode pattern or a back grid electrode pattern.

In some embodiments, the first dielectric layer 131 is at least one of an anti-reflection layer or a passivation layer.

Figure 2:
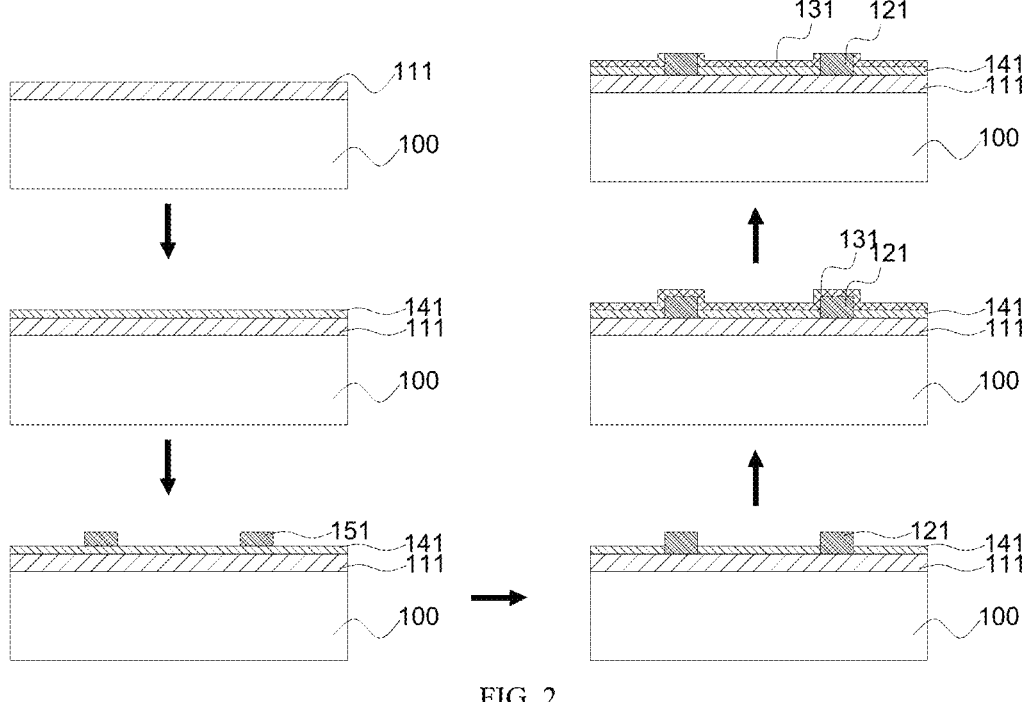
FIG. 2 is a schematic view of a method for preparing a solar cell according to another embodiment of the present application.

In some embodiments, referring to FIG. 2, the solar cell further includes a second dielectric layer 141 disposed between the first conducting layer 111 and the first electrode pattern 121, and the first electrode pattern 121 penetrates through the second dielectric layer 141, so as to be electrically connected to the first conducting layer 111. In these embodiments, the preparation method further includes:

forming the second dielectric layer 141 on the side of the first conducting layer 111 away from the substrate 100 before forming the first electrode pattern 121;

forming a first conductive paste pattern 151 on the surface of the second dielectric layer 141 away from the substrate 100, where the first conductive paste pattern 151 matches the first electrode pattern 121 in shape; and sintering the first conductive paste pattern 151, causing the first conductive paste pattern 151 to burn through the second dielectric layer 141, such that an ohmic contact is formed between a conductive material in the first conductive paste pattern 151 and the first conducting layer 111, thereby forming the first electrode pattern 121.

In some embodiments, the second dielectric layer 141 can be a passivation layer.

In some embodiments, forming the first dielectric layer 131 on the side of the first electrode pattern 121 away from the substrate 100 includes:

depositing the first dielectric layer 131 on the side of the first electrode pattern 121 away from the substrate 100, thereby covering the first electrode pattern 121 and a portion of the first surface, beyond the first electrode pattern 121, with the first dielectric layer 131.

In some embodiments, removing the portion of the first dielectric layer 131 corresponding to the first soldering pattern includes:

laser ablating the portion of the first dielectric layer 131 corresponding to the first soldering pattern.

The portion of the first dielectric layer 131 can precisely removed by using laser removal, which is convenient and flexible, and the material of the dielectric layer can completely removed from the laser ablated portion. Once the laser parameters are set, the laser removal can be performed easily and conveniently. The welding strength of the electrode formed by the laser removal is consistent with that of a traditional electrode. In addition, since the electrode pattern exists at the location of laser removal, it can function as protection during the laser removal process, preventing damage to the substrate 100.

In some embodiments, laser ablating the portion of the first dielectric layer 131 corresponding to the first soldering pattern includes:

patterning a laser beam into a plurality of laser spots through a scanning galvanometer mirror, the plurality of laser spots being in a preset pattern matching the first soldering pattern in shape; and projecting the plurality of laser spots onto the portion of the first dielectric layer 131 corresponding to the first soldering pattern, e.g., onto local areas corresponding to soldering pads, and removing the portion of the first dielectric layer 131 by laser ablation.

In some embodiments, before patterning the laser beam, the method further includes amplifying and focusing the laser beam.

Figure 3:
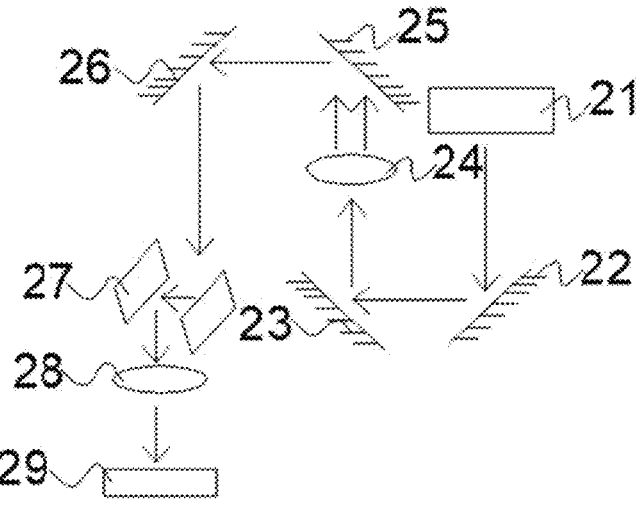
FIG. 3 is a schematic structural view of a laser device according to yet another embodiment of the present application.

Referring to FIG. 3, in some embodiments, laser ablating is performed by using a laser device. The laser device includes a laser 21 and a scanning galvanometer mirror 27. The scanning galvanometer mirror 27 is configured to control the laser 21 to emit a laser beam for locally removing the first dielectric layer 131 located on the first soldering pattern.

In some embodiments, the scanning galvanometer mirror 27 includes a digital scanning galvanometer mirror 27. The scanning galvanometer mirror 27 is connected to a motion controller. The motion control software installed in the motion controller can precisely control the scanning galvanometer mirror to move, forming the laser ablation pattern and ensuring the processing accuracy.

The scanning galvanometer mirror 27 includes an X-axis galvanometer mirror and a Y-axis galvanometer mirror, which can respectively move horizontally and vertically. When the laser beam reaches the X-axis galvanometer mirror, the direction of the laser deflects horizontally; when the laser beam reaches the Y-axis galvanometer mirror, the direction of the laser deflects vertically. The laser beam can be precisely controlled by controlling the moving frequencies and amplitudes of the X-axis and Y-axis galvanometer mirrors.

In some embodiments, the laser device further includes a beam expander 24 and a field lens 28. The laser beam emitted from the laser 21 sequentially reaches the beam expander 24, the scanning galvanometer mirror 27, and the field lens 28.

The beam expander 24 is configured to expand the incoming laser beam. The field lens 28 is configured to focus the laser beam.

In some embodiments, the field lens 28 includes an F−θ field lens. The F−θ field lens is a flat-field scanning lens made of high-transmittance optical glass as the base material. The F−θ field lens is composed by a group of lenses with a specific design integrated in a mechanical casing. The focal height is F×θ, where θ is the incident angle of the incoming beam. Hence, the angular velocity of the input beam is directly proportional to that of the output beam, enabling a scanning mirror to rotate at a constant angular velocity, improving the incidence of edge beams, making the light uniform, compensating for field curvature and distortion of the system, etc. Moreover, the F−θ field lens provides a flat field image plane while greatly simplifying the control circuit, has a high transmittance, a wide scanning range, a low aberration, and a low F−θ distortion.

In some embodiments, the laser device includes multiple reflecting mirrors, such as a first reflecting mirror 22, a second reflecting mirror 23, a third reflecting mirror 25, and a fourth reflecting mirror 26. The reflecting mirrors reflect the laser, adjusting the laser path. It can be understood that the number and position of the reflecting mirrors, as well as the positions of the scanning galvanometer mirror 27, the beam expander 24, and field lens 28, can be adjusted according to the needs, thereby enabling the light to sequentially reach the beam expander 24, the scanning galvanometer mirror 27, and the field lens 28.

It should be noted that in the present application, the laser frequency, speed, pulse width, and diameter of the laser spot adopted in the laser ablation are not specified or limited, and those skilled in the art can reasonably choose these parameters according to the material and thickness of the first dielectric layer 131 to be processed.

In some embodiments, the laser device further includes a worktable 29, and the substrate 100 for the laser ablation is placed on the worktable 29.

In some embodiments, the frequency of the laser beam adopted in the laser ablation ranges from 1.5 MHz to 2.5 MHz, e.g., can be 1.5 MHz, 1.6 MHz, 1.7 MHz, 1.8 MHz, 1.9 MHz, 2.0 MHz, 2.1 MHz, 2.2 MHz, 2.3 MHz, 2.4 MHz, or 2.5 MHz.

In some embodiments, the moving speed of the laser beam ranges from 200 mm/s to 300 mm/s, e.g., can be 200 mm/s, 210 mm/s, 220 mm/s, 230 mm/s, 240 mm/s, 250 mm/s, 260 mm/s, 270 mm/s, 280 mm/s, 290 mm/s, or 300 mm/s.

In some embodiments, the pulse width of the laser beam adopted in the laser ablation ranges from 10 ps to 50 ns, e.g., can be 10 ps, 50 ps, 100 ps, 500 ps, Ins, 5 ns, 10 ns, 15 ns, 20 ns, 30 ns, 40 ns, or 50 ns. In some embodiments, the pulse width of the laser beam ranges from 10 ps to 1000 ps, which is beneficial to reducing damages to the dielectric layer during the laser ablation.

In some embodiments, the diameter of the laser spot of the laser beam adopted in the laser ablation ranges from 8 μm to 500 μm, e.g., can be 8 μm, 10 μm, 20 μm, 50 μm, 100 μm, 150 μm, 200 μm, 250 μm, 300 μm, 350 μm, 400 μm, 450 μm, or 500 μm.

In some embodiments, the first soldering pattern includes one or more rectangular solder spots. The length of each rectangular solder spot ranges from 10 μm to 700 μm, e.g., can be 10 μm, 50 μm, 100 μm, 200 μm, 300 μm, 350 μm, 400 μm, 450 μm, 500 μm, 550 μm, 600 μm, 650 μm, or 700 μm. The width of each rectangular solder spot ranges from 10 μm to 700 μm, e.g., can be 10 μm, 50 μm, 100 μm, 200 μm, 300 μm, 350 μm, 400 μm, 450 μm, 500 μm, 550 μm, 600 μm, 650 μm, or 700 μm.

In some embodiments, the first electrode pattern 121 includes busbars and finger electrodes, and the first soldering pattern is located in the busbars.

In some embodiments, the width of each busbar ranges from 10 μm to 2 mm, e.g., can be 10 μm, 50 μm, 100 μm, 500 μm, 1.0 mm, 1.1 mm, 1.2 mm, 1.3 mm, 1.4 mm, 1.5 mm, 1.6 mm, 1.7 mm, 1.8 mm, 1.9 mm, or 2.0 mm.

In some embodiments, the width of each finger electrode ranges from 10 μm to 40 μm, e.g., can be 10 μm, 13 μm, 16 μm, 19 μm, 22 μm, 25 μm, 28 μm, 31 μm, 34 μm, 37 μm, or 40 μm.

In some embodiments, the interval between adjacent finger electrodes ranges from 0.8 mm to 1.5 mm, e.g., can be 0.8 mm, 0.9 mm, 1.0 mm, 1.1 mm, 1.2 mm, 1.3 mm, 1.4 mm, or 1.5 mm.

Figure 4:
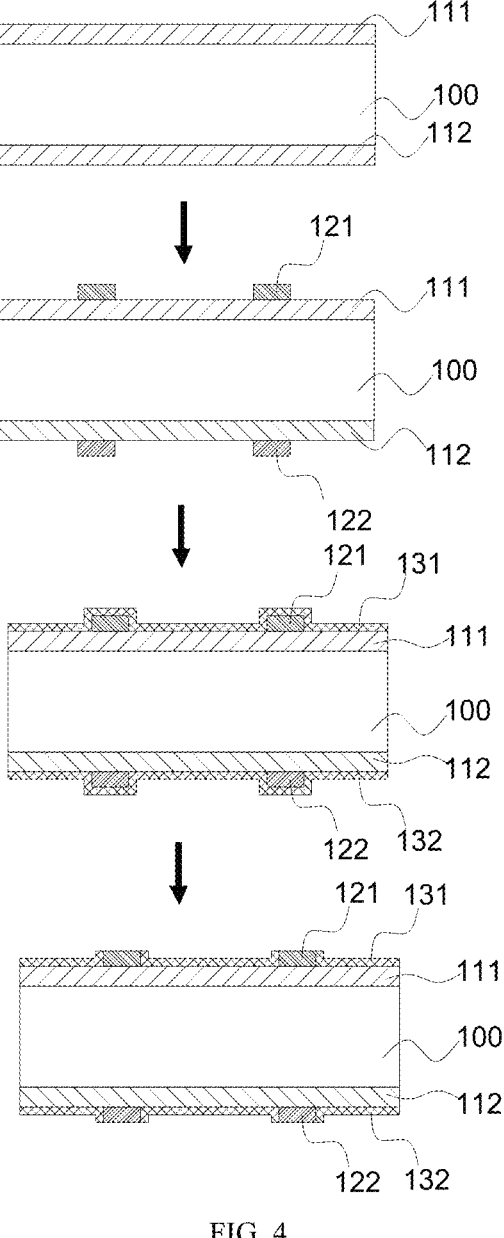
FIG. 4 is a schematic view of a method for preparing a solar cell according to yet another embodiment of the present application.

Referring to FIG. 4, in some embodiments, the solar cell further includes a second conducting layer 112 disposed on the second surface of the substrate 100. In these embodiments, the preparation method further includes:

forming a second electrode pattern 122 on the side of the second conducting layer 112 away from the substrate 100, the second electrode pattern 122 being electrically connected to the second conducting layer 112, the second electrode pattern 122 including a second soldering pattern, the first soldering pattern being configured for soldering to one or more second bus ribbons;

forming a third dielectric layer 132 on the side of the second electrode pattern 122 away from the substrate 100, thereby covering the second electrode pattern 122 with the third dielectric layer 132; and removing the portion of the third dielectric layer 132 corresponding to the second soldering pattern, thereby exposing the second soldering pattern from the remaining third dielectric layer 132.

In some embodiments, the third dielectric layer 132 is at least one of an anti-reflection layer or a passivation layer.

Figure 5:
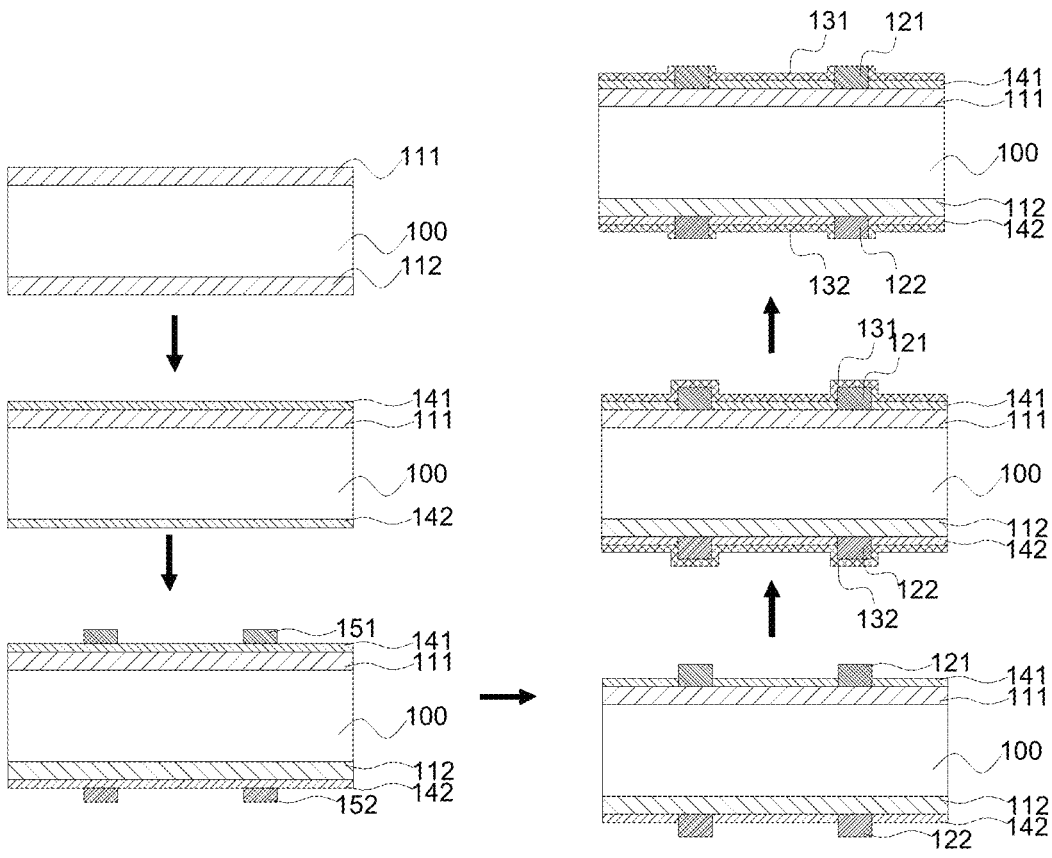
FIG. 5 is a schematic view of a method for preparing a solar cell according to yet another embodiment of the present application.

In some embodiments, referring to FIG. 5, the solar cell further includes a fourth dielectric layer 142 disposed between the second conducting layer 112 and the second electrode pattern 122, and the second electrode pattern 122 penetrates through the fourth dielectric layer 142, so as to be electrically connected to the second conducting layer 112. In these embodiments, the preparation method further includes:

forming the fourth dielectric layer 142 on the side of the second conducting layer 112 away from the substrate 100 before forming the second electrode pattern 122;

forming a second conductive paste pattern 152 on the surface of the fourth dielectric layer 142 away from the substrate 100, where the second conductive paste pattern 152 matches the second electrode pattern 122 in shape; and sintering the second conductive paste pattern 152, causing the second conductive paste pattern 152 to burn through the fourth dielectric layer 142, such that an ohmic contact is formed between a conductive material in the second conductive paste pattern 152 and the second conducting layer 112, thereby forming the second electrode pattern 122.

In some embodiments, the fourth dielectric layer 142 can be a passivation layer.

In some embodiments, forming the third dielectric layer 132 on the side of the second electrode pattern 122 away from the substrate 100 includes:

depositing the second dielectric layer 132 on the side of the second electrode pattern 122 away from the substrate 100, thereby covering the second electrode pattern 122 and a portion of the second surface, beyond the second electrode pattern 122, with the third dielectric layer 132.

According to a second aspect of the present application, an embodiment of a solar cell includes a substrate 100, a first conducting layer 111, a first electrode pattern 121, and a first dielectric layer 131.

The substrate 100 includes a first surface and a second surface opposite to each other in the thickness direction of the substrate 100. The first conducting layer 111 is disposed on the first surface of the substrate 100.

Figure 6:
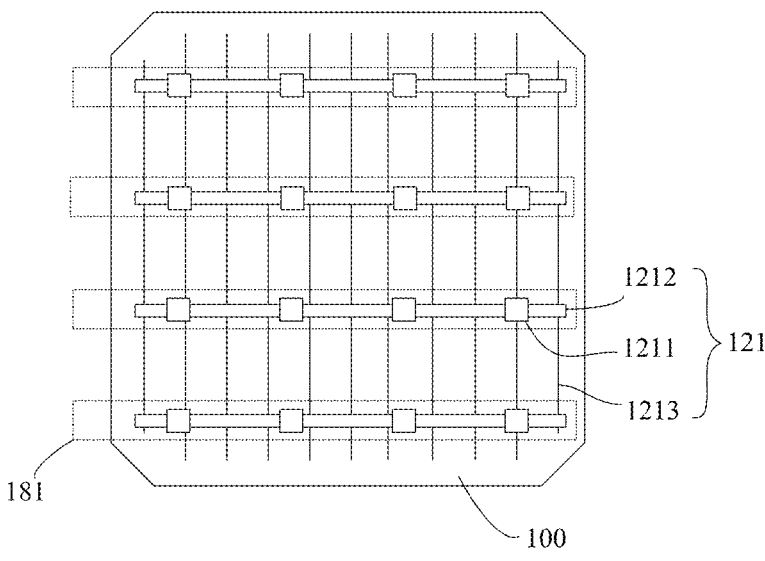
FIG. 6 is a schematic structural top view of a solar cell according to an embodiment of the present application, with some layers omitted.

The first electrode pattern 121 is disposed on the side of the first conducting layer 111 away from the substrate 100. The first electrode pattern 121 is electrically connected to the first conducting layer 111. The first electrode pattern 121 includes a first soldering pattern. Referring to FIG. 6, in some embodiments, the first electrode pattern 121 includes finger electrodes 1213 and busbars 1212. The busbar 1212 includes a linear body and multiple spaced soldering pads connected in series through the linear body. The multiple spaced soldering pads together form the first soldering pattern 1211.

Figure 7:
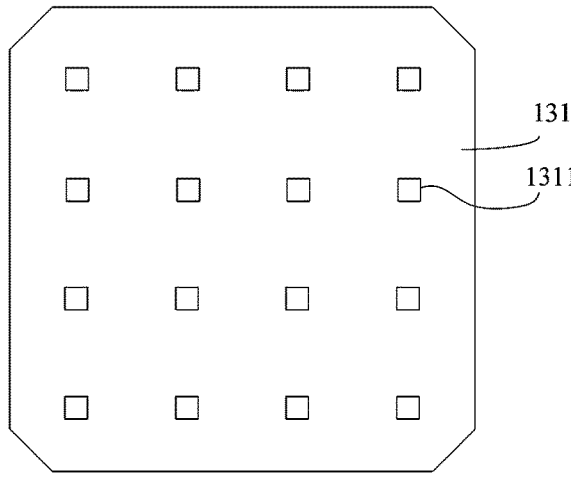
FIG. 7 is a schematic structural view of a first dielectric layer of a solar cell according to an embodiment of the present application.

Referring to FIG. 7, the first dielectric layer 131 is disposed on the side of the first electrode pattern 121 away from the substrate 100. The first dielectric layer 131 includes a plurality of first openings 1311 corresponding to the first soldering pattern 1211, and the first soldering pattern 1211 is exposed from the first dielectric layer 131 through the first openings 1311. The first soldering pattern 1211 is configured for soldering to one or more first bus ribbons 181.

In some embodiments, the first dielectric layer 131 covers a portion of the first surface, and the portion of the first surface is beyond the first soldering pattern 1211.

In some embodiments, the first dielectric layer 131 is made of at least one of silicon dioxide, silicon nitride, silicon oxynitride, or aluminum oxide.

In some embodiments, a thickness of the first dielectric layer 131 ranges from 20 nm to 100 nm, e.g., can be 20 nm, 30 nm, 40 nm, 50 nm, 60 nm, 70 nm, 80 nm, 90 nm, or 100 nm.

In some embodiments, the first electrode pattern 121 is made of at least one of silver, aluminum, nickel, or copper.

In some embodiments, referring to FIG. 4, the surface of the first dielectric layer 131 away from the substrate 100 is aligned with the surface of the first soldering pattern away from the substrate 100.

As the first dielectric layer 131 is removed from the top of the first soldering pattern, and the first dielectric layer 131 and the first soldering pattern have aligned surfaces away from the substrate 100, the first soldering pattern can be conveniently soldered to the bus ribbons.

In some embodiments, the solar cell further includes a second dielectric layer 141 disposed between the first conducting layer 131 and the first electrode pattern 121. The second dielectric layer 141 includes first slots. The first electrode pattern 121 penetrates through the first slots and is electrically connected to the first conducting layer 131.

In some embodiments, the second dielectric layer 141 is made of at least one of silicon dioxide, silicon nitride, silicon oxynitride, or aluminum oxide.

In some embodiments, a thickness of the second dielectric layer 141 ranges from 20 nm to 100 nm, e.g., can be 20 nm, 30 nm, 40 nm, 50 nm, 60 nm, 70 nm, 80 nm, 90 nm, or 100 nm.

In some embodiments, the second electrode pattern 122 is made of at least one of silver, aluminum, nickel, or copper.

In some embodiments, the solar cell further includes a second conducting layer 112, a second electrode pattern 122, and a third dielectric layer 132, which are sequentially stacked on the second surface of the substrate 100.

The second electrode pattern 122 is electrically connected to the second conducting layer 112. The second electrode pattern 122 includes a second soldering pattern. In some embodiments, the second electrode pattern 122 can have a similar structure as the first electrode pattern 121, e.g., shown in FIG. 6.

The third dielectric layer 132 is disposed on the side of the second electrode pattern 122 away from the substrate 100. The third dielectric layer 132 includes a plurality of second openings corresponding to the second soldering pattern, and the second soldering pattern is exposed from the third dielectric layer 132 through the second openings. The second soldering pattern is configured for soldering to one or more second bus ribbons. In some embodiments, the third dielectric layer 132 can have a similar structure as the first dielectric layer 131, e.g., shown in FIG. 7.

In some embodiments, the third dielectric layer is made of at least one of silicon dioxide, silicon nitride, silicon oxynitride, or aluminum oxide.

In some embodiments, a thickness of the third dielectric layer 132 ranges from 20 nm to 100 nm, e.g., can be 20 nm, 30 nm, 40 nm, 50 nm, 60 nm, 70 nm, 80 nm, 90 nm, or 100 nm.

In some embodiments, the solar cell further includes a fourth dielectric layer 142 disposed between the second conducting layer 112 and the second electrode pattern 122.

In some embodiments, the fourth dielectric layer 142 is made of at least one of silicon dioxide, silicon nitride, silicon oxynitride, or aluminum oxide.

In some embodiments, a thickness of the fourth dielectric layer 142 ranges from 20 nm to 100 nm, e.g., can be 20 nm, 30 nm, 40 nm, 50 nm, 60 nm, 70 nm, 80 nm, 90 nm, or 100 nm.

In some embodiments, the third dielectric layer 132 covers a portion of the second surface, and the portion of the second surface is beyond the second soldering pattern.

Figure 8:
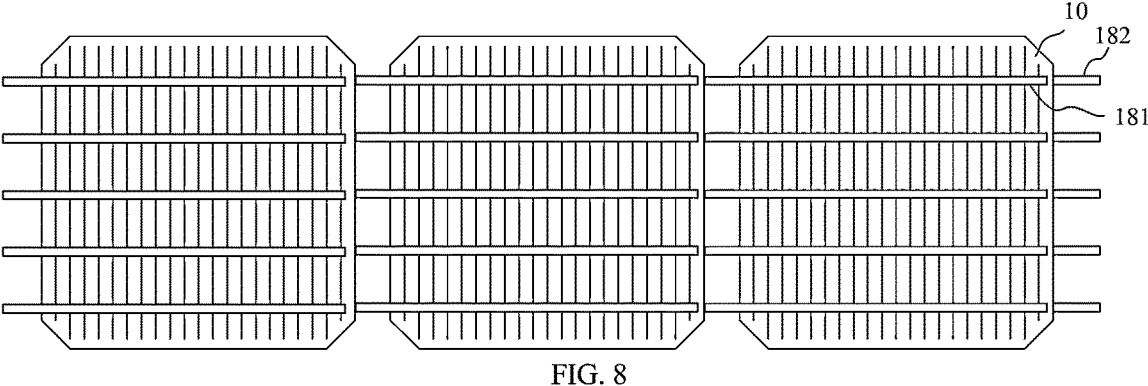
FIG. 8 is a schematic structural top view of a solar cell module according to an embodiment of the present application.
Figure 9:
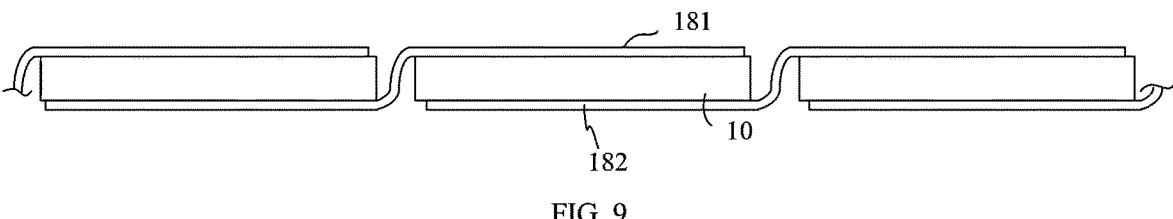
FIG. 9 is a schematic structural side view of a solar cell module according to an embodiment of the present application.

In some embodiments, referring to FIGS. 8 and 9, a plurality of solar cells 10 can be electrically connected to each other through the first and second bus ribbons 181, 182, thereby forming a solar cell module. In each solar cell 10, the busbars 1212 of the first electrode pattern 121 are soldered to the first bus ribbons 181 through the first soldering pattern 121, and the busbars of the second electrode pattern 122 are soldered to the second bus ribbons 182 through the second soldering pattern.

In some embodiments, the solar cell is a tunnel oxide passivated contact (TOPCon) cell, a passivated emitter and rear cell (PERC), an interdigitated back contact (IBC) cell, or a heterojunction (HJT) cell.

Figure 10:
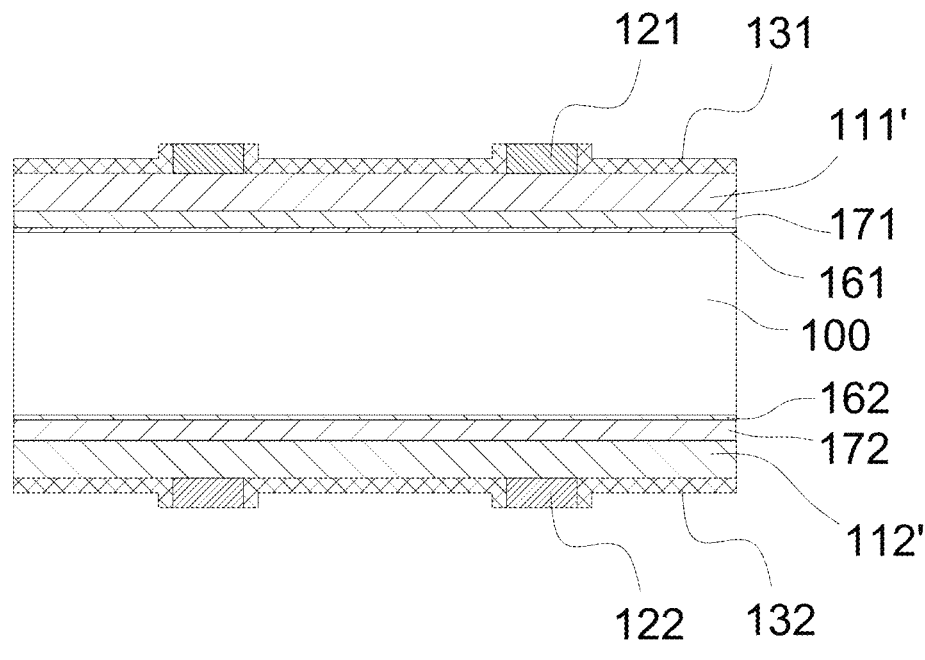
FIG. 10 is a schematic structural sectional view of a solar cell according to an embodiment of the present application.

In some embodiments, referring to FIG. 10, the solar cell is an HJT cell, including a substrate 100. The substrate 100 includes a first surface and a second surface. The HJT cell includes a first amorphous silicon layer 161, a first doping layer 171, a first transparent conducting layer 111', and a first dielectric layer 131 sequentially disposed on the first surface of the substrate 100. The HJT cell further includes a first electrode pattern 121 disposed between the first transparent conducting layer 111' and the first dielectric layer 131. The first electrode pattern 121 includes a first soldering pattern. The first dielectric layer 131 includes a plurality of first openings 1311 corresponding to the first soldering pattern, and the first soldering pattern is exposed from the first dielectric layer 131 through the first openings 1311. The first soldering pattern is configured for soldering to one or more first bus ribbons.

The HJT cell includes a second amorphous silicon layer 162, a second doping layer 172, a second transparent conducting layer 112', and a third dielectric layer 132 sequentially disposed on the second surface of the substrate 100. The HJT cell further includes a second electrode pattern 122 disposed between the second transparent conducting layer 112' and the third dielectric layer 132. The second electrode pattern 122 includes a second soldering pattern. The second dielectric layer 133 includes a plurality of second openings corresponding to the second soldering pattern, and the second soldering pattern is exposed from the third dielectric layer 132 through the second openings. The second soldering pattern is configured for soldering to one or more second bus ribbons.

The following examples are provided to specifically describe the embodiments of the present application. It should be understood that the examples are for illustration only and not intended to limit the scope of the present application. In the following examples, experimental methods not specifying specific conditions should refer first to the guidance given in the present application, or to the experimental manuals or conventional conditions in the art, or to the conditions recommended by manufacturers, or to the experimental methods known in the art.

Example 1

This example provides a PERC cell prepared by the following method.

S1: a p-type silicon wafer as the substrate is provided, and the front surface and the back surface of the silicon wafer are textured.

S2: after texturing, a doping element, e.g., phosphorus, is diffused into the front surface of the silicon wafer to form n-type emitters.

S3: phosphorosilicate glass and the peripheral p-n junction formed during the diffusion are removed, and the back side of the silicon wafer is polished.

S4: the silicon wafer is thermal oxidated at 650° C. for 20 minutes to activate the high-concentration phosphorus layer at the surface of the silicon wafer, thereby reducing the thickness of the dead layer, and then a silicon oxide layer is formed outside the silicon wafer.

S5: a 10 nm-thick $AlO_x$ layer and a 70 nm-thick $SiN_x$:H layer are deposited on the back side of the silicon wafer.

S6: an 80 nm-thick $SiN_x$:H layer is deposited on the front side of the silicon wafer.

S7: linear grooves are formed on the back side of the silicon wafer using laser etching; the grooves penetrate the $AlO_x$ layer and the $SiN_x$:H layer, the number of the grooves is 130, and the width of each groove is 30 μm.

S8: a back conductive paste pattern is screen printed on the back side of the silicon wafer, including aluminum finger electrodes at the laser etched grooves and silver busbars connected to the aluminum finger electrodes; the silver busbar includes a linear body and multiple spaced silver soldering pads connected in series through the linear body; the width of the linear body is 200 μm, and the silver soldering pad has a square shape sized 500 μm×500 μm.

S9: a front conductive paste pattern is screen printed on the front side of the silicon wafer, including silver finger electrodes and silver busbars connected to the silver finger electrodes; the silver busbar includes a linear body and multiple spaced silver soldering pads connected in series through the linear body; the width of the linear body is 200 μm, the width of the silver finger electrode is 30 μm, and the silver soldering pad has a square shape sized 500 μm×500 μm.

S10: the silicon wafer is high-temperature sintered such that the aluminum finger electrodes are formed into an aluminum back field on the back side of the silicon wafer, and the front conductive paste pattern burns through the $SiN_x$:H layer to contact with the n-type emitters, thereby forming a front electrode pattern.

S11: a 40 nm-thick $SiO_x$ dielectric layer is deposited on the front side of the silicon wafer, covering the front electrode pattern formed in S10.

S12: the portion of the dielectric layer formed in S11 located on the soldering pads is removed using laser etching to form openings, thereby exposing the soldering pads through the openings, and the area of the openings is equal to the size of the soldering pads.

S13: the PERC cell prepared as above is transported to the assembly workshop to assemble a solar cell module, where under the heating of infrared lamps, the soldering pads form solder joints with the bus ribbons through the openings formed in S12.

Example 2

This example provides an HJT cell prepared by the following method.

s1: an n-type silicon wafer is cleaned and textured.

s2: following layers are sequentially formed by using plasma enhanced chemical vapor deposition (PECVD) on the silicon wafer:

a 10 nm-thick intrinsic amorphous silicon layer formed on the front side of the n-type silicon wafer;

a 10 nm-thick intrinsic amorphous silicon layer formed on the back side of the n-type silicon wafer;

a 10 nm-thick phosphorus-doped microcrystalline silicon layer formed on the front side of the n-type silicon wafer; and a 10 nm-thick boron-doped microcrystalline silicon layer formed on the back side of the n-type silicon wafer.

s3: 30 nm-thick indium tin oxide (ITO) layers are formed on both the front and back sides of the silicon wafer by using physical vapor deposition (PVD), respectively.

s4: a low-temperature silver paste is screen printed onto the ITO layers on both sides of the silicon wafer, thereby forming a front conductive paste pattern on the front side of the silicon wafer and a back conductive paste pattern on the back side of the silicon wafer; each conductive paste pattern includes finger electrodes and busbars; the busbar includes a linear body and multiple spaced silver soldering pads connected in series through the linear body; the silver soldering pad has a square shape sized 500 μm×500 μm; further, the screen-printed conductive paste patterns are cured at a low temperature, thereby forming a front electrode pattern and a back electrode pattern.

s5: $SiO_x$ dielectric layers with a thickness of 50 nm are formed by using PVD on the front and back sides of the silicon wafer, respectively covering the front and back electrode patterns formed in s4.

s6: the portion of the $SiO_x$ dielectric layer formed in s5 located on the soldering pads is removed using laser etching to form openings, thereby exposing the soldering pads through the openings, and the size of the openings is equal to that of the soldering pads.

s7: the HJT cell prepared as above is transported to the assembly workshop to assemble a solar cell module, where under the heating of infrared lamps, the soldering pads form solder joints with the bus ribbons through the openings formed in s6.

Comparative Example 1

This comparative example provides a PERC cell prepared by the following method.

Sp1: a p-type silicon wafer as the substrate is provided, and the front surface and the back surface of the silicon wafer are textured.

Sp2: after texturing, a doping element, e.g., phosphorus, is diffused into the front surface of the silicon wafer to form n-type emitters.

Sp3: phosphorosilicate glass and the peripheral p-n junction formed during the diffusion are removed, and the back side of the silicon wafer is polished.

Sp4: the silicon wafer is thermal oxidated at 650° C. for 20 minutes to activate the high-concentration phosphorus layer at the surface of the silicon wafer, thereby reducing the thickness of the dead layer, and then a silicon oxide layer is formed outside the silicon wafer.

Sp5: a 10 nm-thick $AlO_x$ layer and a 70 nm-thick $SiN_x$:H layer are deposited on the back side of the silicon wafer.

Sp6: an 80 nm-thick $SiN_x$:H layer is deposited on the front side of the silicon wafer.

Sp7: linear grooves are formed on the back side of the silicon wafer using laser etching; the grooves penetrate the $AlO_x$ layer and the $SiN_x$:H layer, the number of the grooves is 130, and the width of each groove is 30 μm.

Sp8: a back conductive paste pattern is screen printed on the back side of the silicon wafer, including aluminum finger electrodes at the laser etched grooves and silver busbars connected to the aluminum finger electrodes; the silver busbar includes a linear body and multiple spaced silver soldering pads connected in series through the linear body; the width of the linear body is 200 μm, and the silver soldering pad has a square shape sized 500 μm×500 μm.

Sp9: a front conductive paste pattern is screen printed on the front side of the silicon wafer, including silver finger electrodes and silver busbars connected to the silver finger electrodes; the silver busbar includes a linear body and multiple spaced silver soldering pads connected in series through the linear body; the width of the linear body is 200

μm, the width of the silver finger electrode is 30 μm, and the silver soldering pad has a square shape sized 500 μm×500 μm.

Sp10: the silicon wafer is high-temperature sintered such that the aluminum finger electrodes are formed into an aluminum back field on the back side of the silicon wafer, and the front conductive paste pattern burns through the $SiN_x$:H layer to contact with the n-type emitters, thereby forming a front electrode pattern.

Sp11: the PERC cell prepared as above is transported to the assembly workshop to assemble a solar cell module, where under the heating of infrared lamps, the soldering pads form solder joints with the bus ribbons through the openings formed in Sp9.

Comparative Example 2

This comparative example provides an HJT cell prepared by the following method.

Step1: an n-type silicon wafer is cleaned and textured.

Step2: following layers are sequentially formed by using plasma enhanced chemical vapor deposition (PECVD) on the silicon wafer:

a 10 nm-thick intrinsic amorphous silicon layer formed on the front side of the n-type silicon wafer;

a 10 nm-thick intrinsic amorphous silicon layer formed on the back side of the n-type silicon wafer;

a 10 nm-thick phosphorus-doped microcrystalline silicon layer formed on the front side of the n-type silicon wafer; and a 10 nm-thick boron-doped microcrystalline silicon layer formed on the back side of the n-type silicon wafer.

Step3: 30 nm-thick indium tin oxide (ITO) layers are formed on both the front and back sides of the silicon wafer by using physical vapor deposition (PVD), respectively.

Step4: a low-temperature silver paste is screen printed onto the ITO layers on both sides of the silicon wafer, thereby forming a front conductive paste pattern on the front side of the silicon wafer and a back conductive paste pattern on the back side of the silicon wafer; each conductive paste pattern includes finger electrodes and busbars; the busbar includes a linear body and multiple spaced silver soldering pads connected in series through the linear body; the silver soldering pad has a square shape sized 500 μm×500 μm; further, the screen-printed conductive paste patterns are cured at a low temperature, thereby forming a front electrode pattern and a back electrode pattern.

Step5: the HJT cell prepared as above is transported to the assembly workshop to assemble a solar cell module, where under the heating of infrared lamps, the soldering pads form solder joints with the bus ribbons through the openings formed in Step4.

The PERC cells and HJT cells prepared as above are subjected to electrode soldering strength test and photovoltaic conversion efficiency test. The testing methods are as follows:

Soldering strength test: A pull strength tester is used to test the pull strength of the soldering components. The method involves placing the soldered bus ribbon on the pull strength tester, which gradually increases the pull force until the bus ribbon detaches from the solar cell, while recording the pull force at the moment of detachment. This method can be used to assess the soldering strength. The greater the pull force, the stronger the soldering strength.

Photovoltaic conversion efficiency test: The solar cells are tested in a steady state on an IV tester under standard testing conditions (AM1.5, 25° C., 1000 W/m$^2$).

The test results are shown in Table 1.

TABLE 1

| No. | Soldering strength | Conversion efficiency |
|---|---|---|
| Example 1 | 1.75N | 23.6% |
| Example 2 | 1.72N | 25.6% |
| Comparative Example 1 | 1.69N | 23.5% |
| Comparative Example 2 | 1.71N | 25.4% |

It can be seen from the above that the solar cells prepared according to the present methods exhibit superior electrode soldering strength and conversion efficiency compared to those prepared according to conventional methods. In the examples of the present methods, a first electrode pattern including a first soldering pattern is firstly formed on a side of the substrate, which is then covered with a first dielectric layer. The portion of the first dielectric layer corresponding to the first soldering pattern is then removed to expose the first soldering pattern, so as to ensure a stable connection with bus ribbons. The electrode pattern not only include the soldering pattern configured for soldering with the bus ribbons but also protects the substrate, avoiding damages to the substrate in the first dielectric layer partially removing step. Furthermore, the choice of electrode materials is not limited by the choice of dielectric layer materials in the electrode pattern forming process, making the present method applicable to various types of solar cells.

The technical features of the above embodiments can be combined arbitrarily. In order to make the description concise, not all possible combinations of the technical features are described in the embodiments. However, as long as there is no contradiction in the combination of these technical features, the combinations should be considered as within the scope of the present application.

The above-described embodiments are only several implementations of the present application, and the descriptions are relatively specific and detailed, but they should not be construed as limiting the scope of the present application. It should be understood by those of ordinary skill in the art that various modifications and improvements can be made without departing from the concept of the present application, and all fall within the protection scope of the present application. Therefore, the patent protection of the present application shall be defined by the appended claims.

What is claimed is:

1. A method for preparing a solar cell, comprising:
providing a substrate with a first conducting layer, the substrate comprising a first surface and a second surface opposite to each other in a thickness direction of the substrate, the first conducting layer being formed on the first surface;
forming a first electrode pattern on a side of the first conducting layer away from the substrate, the first electrode pattern being electrically connected to the first conducting layer, the first electrode pattern comprising a first soldering pattern, the first soldering pattern being configured for soldering to one or more first bus ribbons;
forming a first dielectric layer on a side of the first electrode pattern away from the substrate, and covering the first electrode pattern with the first dielectric layer; and
removing a portion of the first dielectric layer corresponding to the first soldering pattern, and exposing the first soldering pattern;

wherein the solar cell further comprises a second dielectric layer disposed between the first conducting layer and the first electrode pattern, and the first electrode pattern penetrates through the second dielectric layer to be electrically connected to the first conducting layer, wherein the method further comprises:
forming the second dielectric layer on the side of the first conducting layer away from the substrate before forming the first electrode pattern;
forming a first conductive paste pattern on a surface of the second dielectric layer away from the substrate, where the first conductive paste pattern matches the first electrode pattern in shape; and
sintering the first conductive paste pattern, causing the first conductive paste pattern to penetrate through the second dielectric layer, such that an ohmic contact is formed between a conductive material in the first conductive paste pattern and the first conducting layer, thereby forming the first electrode pattern.

2. The method according to claim 1, wherein forming the first dielectric layer on the side of the first electrode pattern away from the substrate comprises:
depositing the first dielectric layer on the side of the first electrode pattern away from the substrate, thereby covering the first electrode pattern and a portion of the first surface with the first dielectric layer.

3. The method according to claim 1, wherein removing the portion of the first dielectric layer corresponding to the first soldering pattern comprises:
laser ablating the portion of the first dielectric layer corresponding to the first soldering pattern.

4. The method according to claim 3, wherein laser ablating the portion of the first dielectric layer corresponding to the first soldering pattern comprises:
patterning a laser beam into a plurality of laser spots through a scanning galvanometer mirror, the plurality of laser spots being in a preset pattern matching the first soldering pattern in shape; and
projecting the plurality of laser spots onto the portion of the first dielectric layer corresponding to the first soldering pattern, and removing the portion of the first dielectric layer by laser ablation.

5. The method according to claim 4, wherein before patterning the laser beam into the plurality of laser spots through the scanning galvanometer mirror, the method further comprises amplifying and focusing the laser beam.

6. The method according to claim 4, wherein a frequency of the laser beam adopted in a laser ablation ranges from 1.5 MHz to 2.5 MHz, a moving speed of the laser beam ranges from 200 mm/s to 300 mm/s, a pulse width of the laser beam ranges from 10 ps to 50 ns, and a diameter of the laser spot ranges from 8 μm to 500 μm.

7. The method according to claim 1, wherein the first soldering pattern comprises one or more rectangular solder spots, the length of each rectangular solder spot ranges from 10 μm to 700 μm, and the width of each rectangular solder spot ranges from 10 μm to 700 μm.

8. The method according to claim 1, wherein the first electrode pattern comprises busbars and finger electrodes, and the first soldering pattern is located in the busbars.

9. The method according to claim 8, wherein the width of each busbar ranges from 10 μm to 2 mm, and the width of each finger electrode ranges from 10 μm to 40 μm.

10. The method according to claim 1, wherein the solar cell further comprises a second conducting layer, the second conducting layer is formed on the second surface of the substrate; the method further comprises:

forming a second electrode pattern on a side of the second conducting layer away from the substrate, the second electrode pattern being electrically connected to the second conducting layer, the second electrode pattern comprising a second soldering pattern, the second soldering pattern being configured for soldering to one or more second bus ribbons;

forming a third dielectric layer on the side of the second electrode pattern away from the substrate, and covering the second electrode pattern with the third dielectric layer; and removing a portion of the third dielectric layer corresponding to the second soldering pattern, and exposing the second soldering pattern.

11. The method according to claim 10, wherein the solar cell further comprises a fourth dielectric layer disposed between the second conducting layer and the second electrode pattern, and the second electrode pattern penetrates through the fourth dielectric layer to be electrically connected to the second conducting layer; the method further comprises:

forming the fourth dielectric layer on the side of the second conducting layer away from the substrate before forming the second electrode pattern on a side of the second conducting layer away from the substrate;

forming a second conductive paste pattern on a surface of the fourth dielectric layer away from the substrate, where the second conductive paste pattern matches the second electrode pattern in shape;

sintering the second conductive paste pattern, causing the second conductive paste pattern to penetrate through the fourth dielectric layer, such that an ohmic contact is formed between a conductive material in the second conductive paste pattern and the second conducting layer, and forming the second electrode pattern.

12. The method according to claim 10, wherein forming the third dielectric layer on the side of the second electrode pattern away from the substrate comprises:

depositing the third dielectric layer on the side of the second electrode pattern away from the substrate, thereby covering the second electrode pattern and a portion of the second surface with the third dielectric layer.

13. A solar cell, comprising:

a substrate comprising a first surface and a second surface opposite to each other in a thickness direction of the substrate;

a first conducting layer disposed on the first surface of the substrate;

a first electrode pattern disposed on a side of the first conducting layer away from the substrate, the first electrode pattern being electrically connected to the first conducting layer, the first electrode pattern comprising a first soldering pattern;

a first dielectric layer disposed on a side of the first electrode pattern away from the substrate, the first dielectric layer comprising a plurality of first openings corresponding to the first soldering pattern, the first soldering pattern being exposed through the first openings, and the first soldering pattern being configured for soldering to one or more first bus ribbons;

a second dielectric layer disposed between the first conducting layer and the first electrode pattern, the second dielectric layer comprising first slots, the first electrode pattern penetrating through the first slots and being electrically connected to the first conducting layer; and a second dielectric layer disposed between the first conducting layer and the first electrode pattern, the second dielectric layer comprises first slots, the first electrode pattern penetrates through the first slots and is electrically connected to the first conducting layer.

14. The solar cell according to claim 13, wherein the first dielectric layer covers a portion of the first surface, and the portion of the first surface is beyond the first soldering pattern.

15. The solar cell according to claim 13, wherein a surface of the first dielectric layer away from the substrate is aligned with a surface of the first soldering pattern away from the substrate.

16. The solar cell according to claim 13, further comprising a second conducting layer, a second electrode pattern, and a third dielectric layer, which are sequentially stacked on the second surface of the substrate;

wherein the second electrode pattern is electrically connected to the second conducting layer, the second electrode pattern comprises a second soldering pattern; and wherein the third dielectric layer is disposed on a side of the second electrode pattern away from the substrate, the third dielectric layer comprises a plurality of second openings corresponding to the second soldering pattern, the second soldering pattern is exposed through the second openings, and the second soldering pattern is configured for soldering to one or more second bus ribbons.

17. The solar cell according to claim 16, wherein the solar cell further comprises a fourth dielectric layer disposed between the second conducting layer and the second electrode pattern.

18. The solar cell according to claim 16, wherein the third dielectric layer covers a portion of the second surface, and the portion of the second surface is beyond the second soldering pattern.

19. A method for preparing a solar cell, comprising:

providing a substrate with a first conducting layer, the substrate comprising a first surface and a second surface opposite to each other in a thickness direction of the substrate, the first conducting layer being formed on the first surface;

forming a first electrode pattern on a side of the first conducting layer away from the substrate, the first electrode pattern being electrically connected to the first conducting layer, the first electrode pattern comprising a first soldering pattern, the first soldering pattern being configured for soldering to one or more first bus ribbons;

forming a first dielectric layer on a side of the first electrode pattern away from the substrate, and covering the first electrode pattern with the first dielectric layer; and removing a portion of the first dielectric layer corresponding to the first soldering pattern, and exposing the first soldering pattern;

wherein the solar cell further comprises a second conducting layer, the second conducting layer is formed on the second surface of the substrate, and wherein the method further comprises:

forming a second electrode pattern on a side of the second conducting layer away from the substrate, the second electrode pattern being electrically connected to the second conducting layer, the second electrode pattern comprising a second soldering pattern, the second soldering pattern being configured for soldering to one or more second bus ribbons;

forming a third dielectric layer on the side of the second electrode pattern away from the substrate, and covering the second electrode pattern with the third dielectric layer; and removing a portion of the third dielectric layer corresponding to the second soldering pattern, and exposing the second soldering pattern;

wherein the solar cell further comprises a fourth dielectric layer disposed between the second conducting layer and the second electrode pattern, and the second electrode pattern penetrates through the fourth dielectric layer to be electrically connected to the second conducting layer, wherein the method further comprises:

forming the fourth dielectric layer on the side of the second conducting layer away from the substrate before forming the second electrode pattern on a side of the second conducting layer away from the substrate;

forming a second conductive paste pattern on a surface of the fourth dielectric layer away from the substrate, where the second conductive paste pattern matches the second electrode pattern in shape; and sintering the second conductive paste pattern, causing the second conductive paste pattern to penetrate through the fourth dielectric layer, such that an ohmic contact is formed between a conductive material in the second conductive paste pattern and the second conducting layer, and forming the second electrode pattern.

* * * * *